(12) United States Patent
Hirano et al.

(10) Patent No.: US 7,019,395 B2
(45) Date of Patent: Mar. 28, 2006

(54) DOUBLE-SIDED COOLING TYPE SEMICONDUCTOR MODULE

(75) Inventors: Naohiko Hirano, Okazaki (JP); Takanori Teshima, Okazaki (JP)

(73) Assignee: Denso Corporation, Kariya (JP)

( * ) Notice: Subject to any disclaimer, the term of this patent is extended or adjusted under 35 U.S.C. 154(b) by 28 days.

(21) Appl. No.: 10/802,720

(22) Filed: Mar. 18, 2004

(65) Prior Publication Data

US 2005/0073042 A1   Apr. 7, 2005

(30) Foreign Application Priority Data

Mar. 26, 2003   (JP)   ............................. 2003-084435

(51) Int. Cl.
*H01L 23/34*   (2006.01)
(52) U.S. Cl. ...................... 257/717; 257/707; 257/712; 257/714; 257/718; 257/719; 257/720; 361/699
(58) Field of Classification Search ................ 257/707, 257/712, 714, 718, 719, 720; 361/699
See application file for complete search history.

(56) References Cited

U.S. PATENT DOCUMENTS 5,323,292 A * 6/1994 Brzezinski .................. 361/689
6,232,151 B1 * 5/2001 Ozmat et al. ............... 438/122
6,542,365 B1 * 4/2003 Inoue .......................... 361/699

FOREIGN PATENT DOCUMENTS

| JP | U-S61-33448 | 2/1986 |
|---|---|---|
| JP | A-H09-199647 | 7/1997 |
| JP | A-2001-267481 | 9/2001 |

* cited by examiner

*Primary Examiner*—Mai-Huong Tran
(74) *Attorney, Agent, or Firm*—Posz Law Group, PLC

(57) ABSTRACT

A semiconductor module includes a fixed type and transformable type coolers and a flat semiconductor package sandwiched between the coolers. A relative positional relationship of the semiconductor package is fixed with the fixed type cooler, but variable with the transformable type cooler. The transformable type cooler includes a transformable member of a metal thin plate covering a coolant chamber. The semiconductor module includes a sandwiching mechanism causing the fixed type cooler to be pressed toward the transformable type cooler. Fastening adjustment screws of the sandwiching mechanism causes a pressing frame to approach a cooler body of the transformable type cooler. Therefore, the semiconductor package is pressed via the fixed type cooler while the transformable member is slightly transformed. This enhances a degree of contact between the semiconductor package and transformable member via an insulating member.

13 Claims, 5 Drawing Sheets

DOUBLE-SIDED COOLING TYPE SEMICONDUCTOR MODULE

CROSS REFERENCE TO RELATED APPLICATIONS

This application is based on and incorporates herein by reference Japanese Patent Application No. 2003-84435 filed on Mar. 26, 2003.

1. Field of the Invention

The present invention relates to a double-sided cooling type semiconductor module.

2. Background of the Invention

A semiconductor power element used in an inverter circuit for driving an automobile motor is available as a power element package integrated with a mold resin, where a power element is sandwiched between heat sinks of radiating members. The power element includes an IGBT (Insulated Gate Bipolar Transistor) as a typical power element. The power element of the IGBT is sandwiched between the heat sinks while an emitter or collector of the power element is connected using solder with the heat sink directly or via a spacer. Here, the heat sink functions as a path of large electric current.

The above power element package is provided in practical use as a semiconductor module including a cooler linked with the power element package via a thin insulating member. For instance, JP-A-2001-352023 (U.S. Pat. No. 6,542,365) discloses a structure where a pair of cooling tubes as coolers formed of aluminum alloy sandwiches a power element package.

Here, a module formed by assembling a power element package and a cooler sometimes involves an insufficient degree of contact between heat sinks of the power element package and the cooler, unfavorably decreasing a cooling efficiency of the power element. This results from variations in a degree of parallel between both heat sinks, flatness of the cooler, or thickness of an inserted insulating member.

An accuracy of dimensions of the components or an accuracy of assembling can be enhanced to a level of ±0.1 mm; however, a level of ±0.01 mm being small by a factor of 10 is remarkably difficult to be attained. Therefore, a method other than increasing the accuracy of dimensions or assembling is preferably required.

In detail, the above referred patent document discloses a method for enhancing the degree of contact between the heat sink and the cooler. In this method, a thinly processed soft metal member is inserted in addition to an insulating member between the heat sink and the cooler to compensate an irregularity of the contact surfaces. However, further enhancing method is required to strongly and securely cool the power element having a high power output.

SUMMARY OF THE INVENTION

It is an object of the present invention to provide a double-sided cooling type semiconductor module having a structure where a semiconductor chip is properly cooled.

To achieve the above object, a double-sided cooling type semiconductor module having a semiconductor device radiating heat from upper and lower surfaces thereof is provided with the following. A first and second coolers, each of which includes a coolant, are provided for sandwiching the semiconductor device. A sandwiching mechanism is provided for causing the two coolers to tightly sandwich the semiconductor device. At least one of the two coolers includes a transformable member. The transformable member includes a first surface facing the coolant and a second surface facing the semiconductor device. The transformable member is transformable to be flexed in a coolant direction or a semiconductor device direction.

This structure can compensate slight dimensional variations from design dimensions such as dimensional tolerances of a practical semiconductor device or cooler, leading to decrease of heat resistance.

BRIEF DESCRIPTION OF THE DRAWINGS

The above and other objects, features, and advantages of the present invention will become more apparent from the following detailed description made with reference to the accompanying drawings. In the drawings.

DETAILED DESCRIPTION OF THE PREFERRED EMBODIMENTS (First Embodiment)

Figure 1:
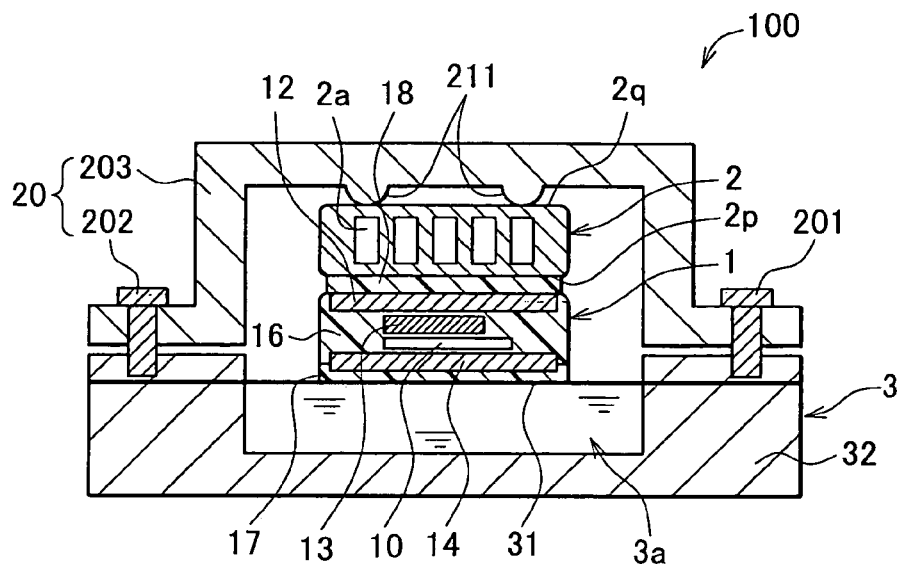
FIG. 1 is a sectional view of a schematic structure of a double-sided cooling type semiconductor module according to a first embodiment of the present invention.

The present invention is directed to a double-sided cooling type semiconductor module. Referring to FIG. 1, a double-sided cooling type semiconductor module 100 of a first embodiment is a module where a flat semiconductor package 1 is sandwiched between a fixed type cooler 2 and a transformable type cooler 3. Between the semiconductor package 1 and either of the cooler 2, 3, an insulating member 17, 18 of a sheet type is inserted. Further, the semiconductor module 100 includes a sandwiching mechanism 20 that causes the coolers 2, 3 to tightly sandwich the semiconductor package 1.

A relative positional relationship of the semiconductor package 1 is fixed with the fixed type cooler 2, but variable with the transformable type cooler 3. Fastening adjustment screws 201, 202 of the sandwiching mechanism 20 enables a pressing frame 203 to approach a cooler body 32 of the transformable type cooler 3. Therefore, the semiconductor package 1 is pressed via the fixed type cooler 2 while the transformable member 31 is slightly transformed. This enhances a degree of contact between the semiconductor package 1 and transformable member 31 via the insulating member 17.

The semiconductor package 1 includes a semiconductor chip 10 and radiating members (heat sinks) 12, 14 that sandwich the semiconductor chip 10, all of which are integrated with a mold resin member 16. For instance, this semiconductor package 1 constitutes a part of a three-phase inverter circuit for a brushless motor. The semiconductor chip 10 includes, e.g., an IGBT (Insulated Gate Bipolar Transistor) or a power MOSFET. The IGBT connected with inductive load such as a motor is parallelly connected with a reversed free wheel diode (not shown in FIG. 1).

The semiconductor chip 10 of a thin plate shape has an exposed gate and an exposed emitter (or source) on a surface of its own, and has a collector (or drain) in an opposite surface. The semiconductor chip 10 is electrically connected with the heat sinks 12, 14, directly or via a spacer 13, respectively, e.g., using solder connection members. The emitter and collector of the semiconductor chip 10 are thereby electrically connected with the heat sinks 12, 14, respectively. In addition, the semiconductor chip 10 includes an exposed gate on the surface where the emitter is exposed. The gate is further electrically connected with a lead terminal (not shown) for control signals, which outwardly protrudes from the mold resin member 16.

Each of the heat sinks 12, 14 of a flat shape or plate shape has a heat accepting surface facing the semiconductor chip 10 and an opposite radiating surface, both of which are adjusted to be substantially plane. The heat sinks 12, 14 are assembled to be substantially parallel with each other. Each of the heat sinks 12, 14 is favorably formed of a pure metal selected from a group of Cu, W, Mo, and Al or an alloy that is mainly composed of the metals selected from the group from the view point of thermal and electrical conductivity.

Further, the mold resin member 16 is formed to cover or coat the peripheral sides of the semiconductor chip 10 and filling the space formed by the heat sinks 12, 14. The mold resin member 16 is formed of, e.g., an epoxy resin. The heat sinks 12, 14 are, respectively, integrated with lead terminals 120, 140 for large electric current, the lead terminals which outwardly protrude from the mold resin member 16 (e.g., refer to FIG. 8 that will be explained later). In FIG. 1, the lead terminals 120, 140 are disposed to extend perpendicularly to the figure surface.

The fixed type cooler 2 is a coolant tube of a flat shape that is formed by shaping easily-shaped metal such as alumina and alumina alloy. The fixed type cooler 2 includes at least one coolant path 2a through which a coolant such as water is circulated via a circulating cooling device (not shown). The fixed type cooler 2 further includes a plane heat accepting surface 2p and a plane pressed surface 2q that is opposite to the heat accepting surface 2p via the coolant path 2a. The heat accepting surface 2p outwardly faces the semiconductor module 1 via the insulating member 18, while the pressed surface 2q is in contact with a pressing frame 203.

The transformable type cooler 3 includes a cooler body 32 forming a coolant chamber 3a and a transformable member 31 whose periphery is fixed to the cooler body 32. Through the coolant chamber 3a of the transformable type cooler 3, a coolant such as water is circulated similarly with that of the fixed type cooler 2. The transformable member 31 has a first surface facing the coolant and sealing the coolant chamber 3a, and an opposite second surface facing the semiconductor package 1 via the insulating member 17. The dimension of the surfaces (heat accepting surfaces) of the transformable member 31 is designed to be much larger than that of radiating surfaces (upper and lower surfaces) of the semiconductor package 1.

The transformable member 31 can be formed of one or multiple layers of metal thin plates. The transformable member 31 is preferable provided with high corrosion resistance and adequate flexibility. In detail, it can be formed of material such as copper, copper alloy, alumina, alumna alloy, or stainless steel.

Figure 2:
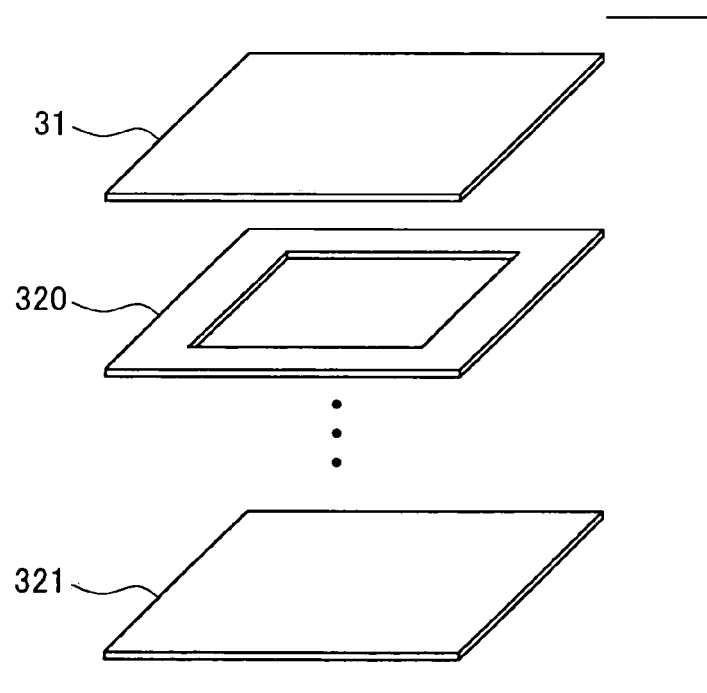
FIG. 2 is a perspective view explaining an assembling procedure of a cooler body according to the first embodiment.

In this first embodiment, the cooler body 32 can be formed of a metal laminate that is formed by piling up metal thin plates using material (copper, copper alloy, alumina, alumna alloy, or stainless steel) equal to or different from that of the transformable member. This enables preferable heat conductivity. In detail, as shown in FIG. 2, the cooler body 32 is formed using a metal thin plate 321 being a bottom, metal thin plates 320 forming the sides of the coolant chamber 3a, and a metal plate of the transformable member 31 as a cover of the coolant chamber 3a; all of the metal thin plates 321, 320, 31 are piled and jointed using a connecting member such as a brazing member. Here, through the coolant chamber 3a, a coolant such as water is circulated via a circulating cooling device similarly with that of the fixed type cooler 2.

As shown in FIG. 1, the sandwiching mechanism 20 that causes the coolers 2, 3 to tightly sandwich the semiconductor package 1 includes a metal-made pressing frame 203 and adjusting screws 201, 202. The pressing frame 203 is disposed to cover the fixed type cooler 2 while including convex portions 211, 211 facing the pressed surface 2q of the fixed type cooler 2 to increase efficiency of pressing the pressed surface 2q. The adjusting screws 201, 202 screw to screw holes formed on the cooler body 32 of the transformable type cooler 3 to fasten the pressing frame 203 to the cooler body 32. A washer or a spring washer can be used to tightly fasten.

Fastening the adjusting screws 201, 202 causes the pressing frame 203 to approach the cooler body 32 of the transformable type cooler 3. Simultaneously, the convex portions 211 press the pressed surface 2q of the fixed type cooler 2. The semiconductor package 1 is thereby pressed via the fixed type cooler 2, so that the transformable member 31 of the metal thin plate is very slightly transformed to cause elastic or plastic transformation. This compensates inevitable misalignment from the designed dimension regarding degrees of parallel of the heat sinks 12, 14, flatness of the fixed type cooler 2, or thickness of the inserted insulating members 17, 18. Gaps are thereby not easily produced while heat resistance can be decreased. The pressing presser or force with which the pressing frame 203 provides the fixed type cooler 2 is varied according to a fastening amount of the adjusting screws 201, 202. Within an allowable limit, a variation amount of the transformable member 31 can be adjustable.

The dimensional tolerance of the semiconductor device or cooler is approximately ±100 μm. To compensate this dimensional tolerance, the variation amount of the transformable member can be limited to a slight amount. Further, the transformable member 31 formed of a metal thin plate can restrict an aged variation (decrease) of the pressing pressure.

Figure 3:
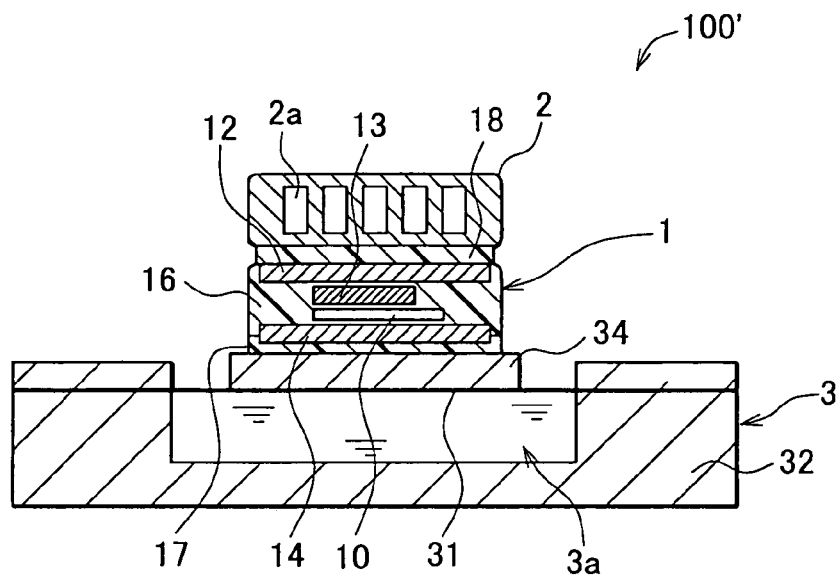
FIG. 3 is a sectional view of a schematic structure of a double-sided cooling type semiconductor module according to a modification of the first embodiment.

Further, as a body integrated with or separated from the transformable member 31, a metal spacer 34 can be disposed as shown in FIG. 3. Here, raising the bottom using the metal spacer 34 enables the lead terminals 120, 140 for large current to be easily installed (refer to FIG. 5). In addition, the metal spacer 34 can be fixed to the semiconductor package 1, so that the semiconductor module 100 can be easily assembled.

(Second Embodiment)

Figure 4:
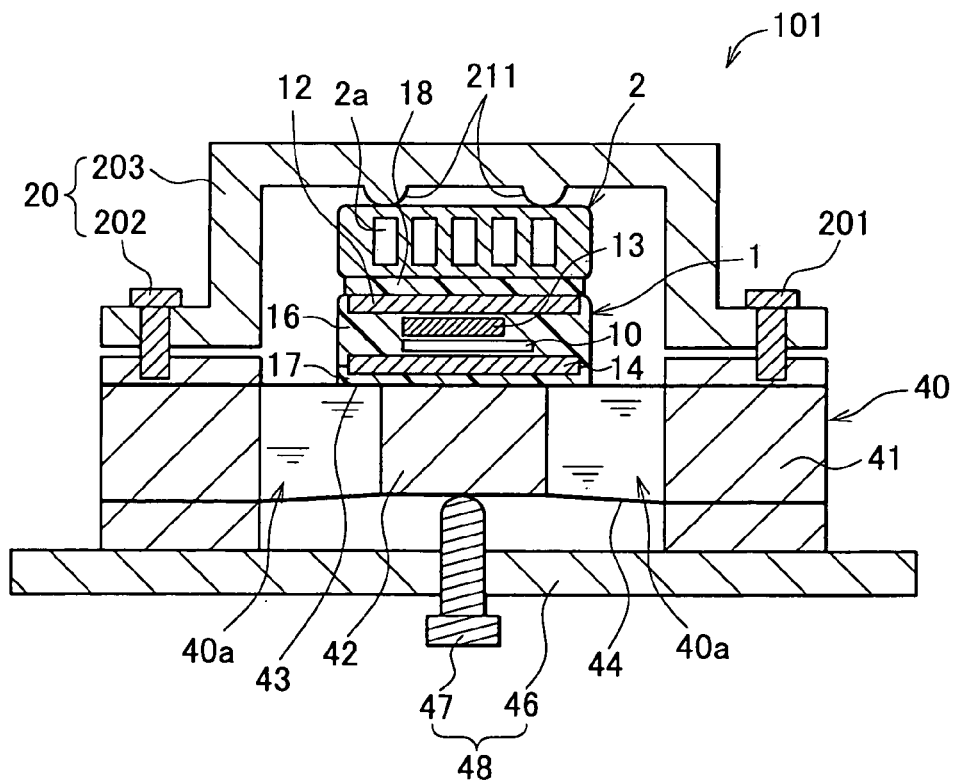
FIG. 4 is a sectional view of a schematic structure of a double-sided cooling type semiconductor module according to a second embodiment of the present invention.
Figure 5:
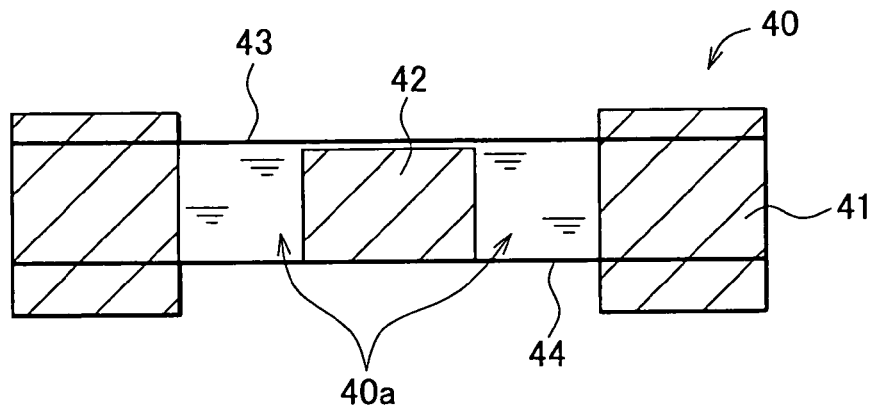
FIG. 5 is a sectional view of a cooler according to the second embodiment.

A double-sided cooling type semiconductor module 101 of a second embodiment is shown in FIG. 4, while a transformable type cooler 40 of the module 101 is shown in FIG. 5. This semiconductor module 101 is almost similar to the semiconductor module 100 of the first embodiment, so that explanation relating to common parts will be eliminated below.

As shown in FIG. 5, a cooler body 41 of the transformable type cooler 40 has a frame structure to seal a coolant chamber 40a with a first transformable member 43 and second transformable member 44. The first and second transformable members 43, 44 are formed of, e.g., metal thin plates similarly to the transformable member 31 shown in FIG. 1. The periphery of the first and second transformable members 43, 44 are fixed to the cooler body 41.

Figure 6:
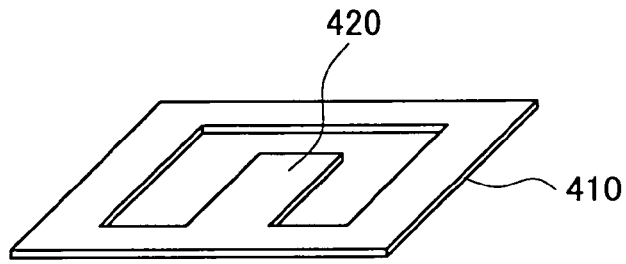
FIG. 6 is a perspective view of a component of a cooler body having a support member according to a modification of the second embodiment.

The first transformable member 43 has a surface facing coolant and an opposite surface being a heat accepting surface. The second transformable member 44 faces the first transformable member 43 via a coolant chamber 40a while including a support member 42 that protrudes toward the first transformable member 43 within the coolant chamber 40a. The support member 42 can be a metal block disposed on a surface of the second transformable member 44 that faces the coolant; otherwise, it can be a metal laminate constituted by a metal thin plate 410 (shown in FIG. 6) having a non-penetrating portion 420 to constitute the support member 42. Namely, the metal thin plate 410 is formed by boring a hole therein such that the non-penetrating portion 420 remains; moreover, as shown in FIG. 2, the metal thin plates including the metal thin plate 410 are piled up to constitute a cooler body 41. This enables an integrated formation of the cooler body 41 and support member 42.

As shown in FIG. 4, the semiconductor module 101 includes the above-mentioned transformable type cooler 40, a semiconductor package 1, a fixed type cooler 2, and first and second sandwiching mechanisms 20, 48. The first sandwiching mechanism 20 is previously explained as the first embodiment. The second sandwiching mechanism 48 has a fixed relative positional relationship with the cooler body 41. In detail, the sandwiching mechanism 48 includes a metal-made base member 46 where the cooler body 41 is fixed and an adjusting screw 47 provided in the base member 46.

The base member 46 includes a screw hole where the adjusting screw 47 is fastened; the adjusting screw 47 is movable to approach or depart from the second transformable member 44. Namely, fastening the adjusting screw 47 causes the top of it to be in contact with the second transformable member 44. Furthermore, increase of the fastening amount of the screw 47 causes the support member 42 to approach the first transformable member 43. The support member 42 thereby presses or supports the first transformable member 43 from an inside of the coolant chamber 40a. Thus, the semiconductor package 1 is sandwiched between the two coolers 2, 40. A slight transformation of the first transformable member 43 can absorb the dimensional tolerance of the components to decrease the gaps between the components, suppressing the heat resistance.

Further, according to a fastening amount of the adjusting screw 47 pressing the support member 42, a movable amount of the support member 42 toward the first transformable member 43 is varied; then, according to the movable amount of the support member 42 pressing the first transformable member 43, a variation amount of the first transformable member 43 toward the semiconductor package 1 is varied. Therefore, slightly adjusting the adjusting screw 47 can prevent forcible pressure or lack of pressing pressure on the semiconductor package 1. This can thereby prevent damage of the semiconductor package 1 due to forcible pressure. Further, after the semiconductor package 1 is set between the coolers 2, 40, the sandwiching mechanism 48 can then tightly sandwich the semiconductor package 1, enhancing the easiness of assembling the semiconductor module 101.

Here, the pressing frame 203 and adjusting screws 201, 202 function also as a fixing mechanism that fixes the relative positional relationship between the cooler body 41 of the transformable type cooler 40a and the fixed type cooler 2. However, as explained in the first embodiment, the adjusting screws 201, 202 can be manipulated to be fastened so that the semiconductor package 1 can be tightly sandwiched through both the upper and lower surfaces.

Figure 7:
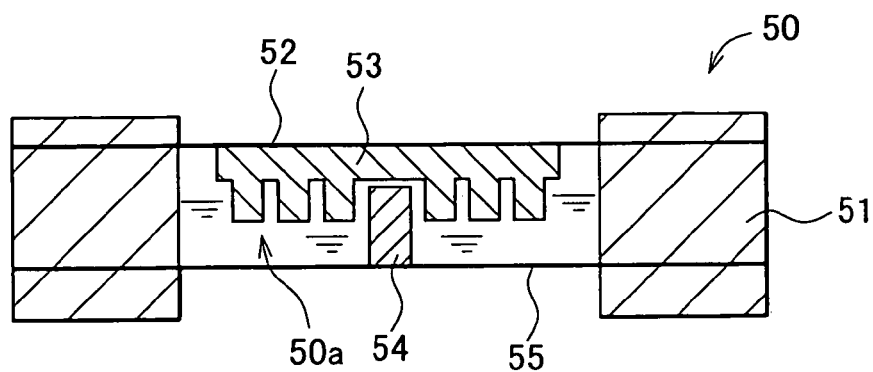
FIG. 7 is a sectional view of a cooler according to a modification of the second embodiment.

Furthermore, as shown in FIG. 7, a transformable type cooler 50 that includes cooling fins 53 exposed to an inside of the coolant chamber 50a can be adopted. Adopting of this cooler 50 can provide a semiconductor module that securely cools the semiconductor package 1. The cooling fins 53 can have a shape such as cycles of concavity and convexity that include more dimensions of contact with the coolant than the plane shape. The cooling fins 53 can be disposed to be fixed to the first transformable member 52 where the semiconductor package 1 is mounted. Here, the second transformable member 55 can be disposed to face the first transformable member 52 via the cooling chamber 50a; moreover, the second transformable member 55 fixes the support member 54 protruding toward the first transformable member 52 within the coolant chamber 50a.

(Third Embodiment)

Figure 8:
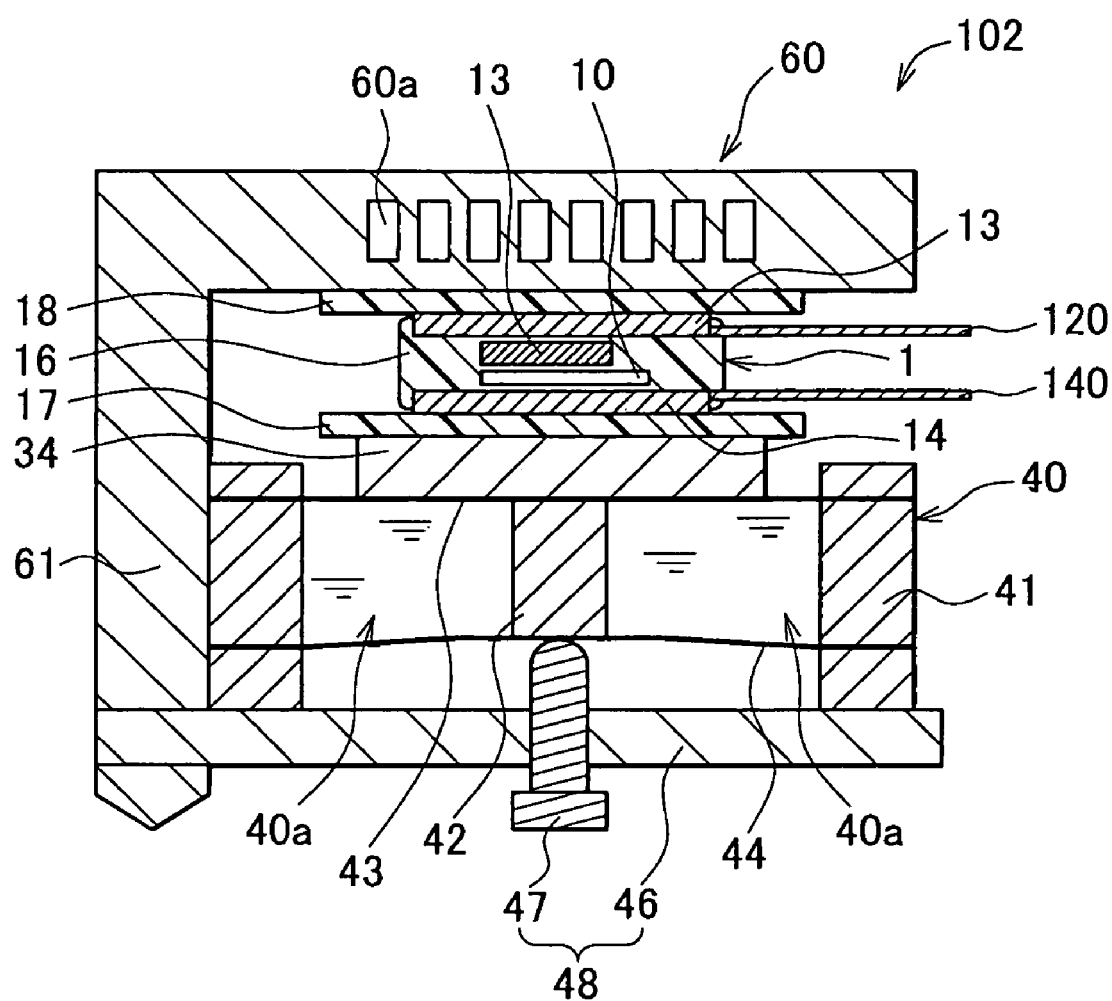
FIG. 8 is a sectional view of a schematic structure of a double-sided cooling type semiconductor module according to a third embodiment of the present invention.

A double-sided cooling type semiconductor module 102 of a third embodiment is shown in FIG. 8. This semiconductor module 102 includes a semiconductor package 1, a fixed type cooler 60, a transformable type cooler 40 that is the same as the cooler 40 in FIG. 4, and a sandwiching mechanism 48. This sandwiching mechanism includes a base member 46. The base member 46 and fixed type cooler 60 is linked by a linking member 61 so that a relative positional relationship therebetween is fixed. In this semiconductor module 102, proper fastening of an adjusting screw 47 causes the semiconductor package 1 to be tightly sandwiched between the transformable type cooler 40 and fixed type cooler 60. Therefore, this embodiment substantially exhibits the same effect as the second embodiment.

The linking member 61 is a metal member integrated with or separated from the fixed type cooler 60. The fixed type cooler 60 of a flat shape includes one or multiple cooling paths 60a. The linking member 61 is connected to be fixed at its one end to the base member 46 and at the other end to a portion of the fixed type cooler 60, the portion which containing no cooling path 60a. The base member 46 is fixed to the cooler body 41 of the transformable type cooler 40. As a result, as shown in FIG. 8, the fixed type cooler 60, the linking member 61, and the base member 46 are assembled to have a U-shaped cross section within which the semiconductor package 1 and the transformable type cooler 40 are disposed. Thus, the linking member 61 accurately fixes a relative positional relationship between the fixed type cooler 60 and the cooler body 41 of the transformable type cooler 40. The sandwiching force for sandwiching the semiconductor package 1 is controlled by the sandwiching mechanism 48 and the transformable member 43, 44.

Further, as shown in FIG. 8, the lead terminals 120, 140 for large current are outwardly extending in a direction parallel with the surfaces of the semiconductor package 1.

(Fourth Embodiment)

Figure 9:
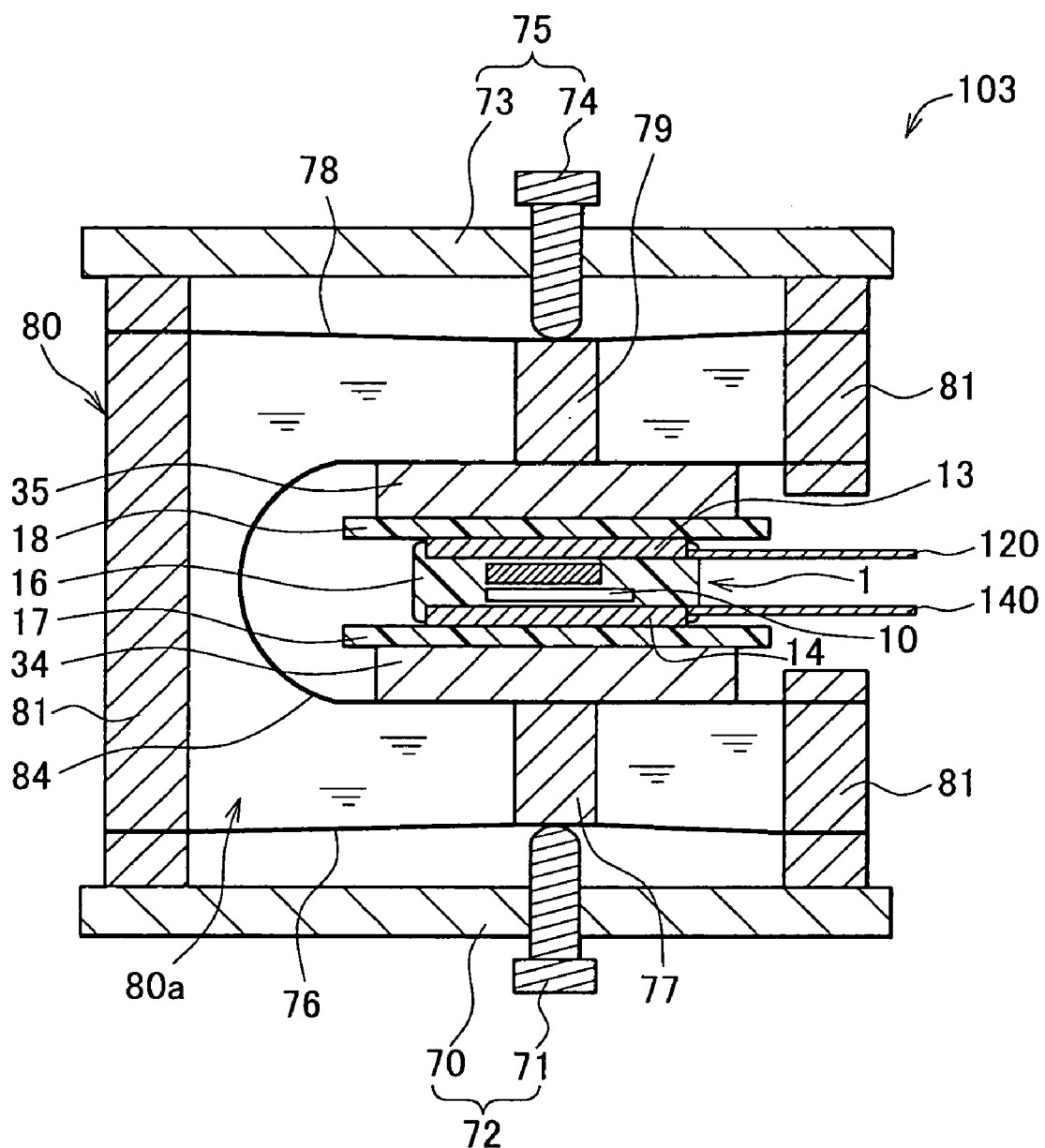
FIG. 9 is a sectional view of a schematic structure of a double-sided cooling type semiconductor module according to a fourth embodiment of the present invention.

A double-sided cooling type semiconductor module 103 of a fourth embodiment is shown in FIG. 9. This semiconductor module 103 is defined such that a semiconductor package 1 is sandwiched between a pair of two transformable type coolers. Further, this pair of two transformable type coolers is integrated as a cooler 80 having a U-shaped cross section as shown in FIG. 9.

The cooler 80 includes a cooler body 81, transformable members 76, 78, 84 whose peripheries are fixed to the cooler body 81, and sandwiching mechanisms 72, 75 disposed on the upper and lower locations of the cooler 80. Here, the transformable member 76, 78, 84 are used as covers for a coolant chamber 80a. The transformable members 76, 78, 84 are formed of metal thin plates similarly with those of the foregoing embodiments. Here, the transformable member 84 absorbing heat from the semiconductor package 1 is previously shaped to have a U-shaped cross section. The coolant chamber 80a is thereby formed to wrap around the semiconductor package 1 and to fluidly communicate from the upper location of the semiconductor package 1 to the lower location. Namely, the cooler 80 is approximately symmetric with respect to the semiconductor package 1 in the upper and lower locations of the semiconductor package 1.

The semiconductor package 1 is disposed within the transformable member 84 absorbing the heat via insulating members 17, 18 and spacers 34, 35. The sandwiching mechanisms 72, 75 include base members 70, 73 and adjusting screws 71, 74, respectively. Control of fastening amounts of the adjusting screws 71, 74 results in control of movable amounts of support members 77, 79, leading to control of variation amounts of the transformable members 76, 78, 84. Thus, the semiconductor package 1 is supported within the U-shaped space.

(Others)

In the above embodiments, the sandwiching mechanism can use a pressure of a coolant that is circulated through the coolers.

The above embodiments can be combined mutually to be effective. Further, explanation for one embodiment can be also used for another embodiment.

It will be obvious to those skilled in the art that various changes may be made in the above-described embodiments of the present invention. However, the scope of the present invention should be determined by the following claims.

What is claimed is:

1. A double-sided cooling type semiconductor module comprising:

a semiconductor device;

first and second coolers sandwiching the semiconductor device, wherein each of the first and second coolers includes a coolant; and sandwiching means causing the first and second coolers to tightly sandwich the semiconductor device, wherein at least the first cooler includes a transformable member, the transformable member includes a first surface facing the coolant and a second surface facing the semiconductor device, the transformable member is transformable to be flexed in one of a coolant direction and a semiconductor device direction, and the first cooler that includes the transformable member is a transformable type cooler while the second cooler is a fixed type cooler whose positional relationship with the semiconductor device is fixed.

2. The double-sided cooling type semiconductor module of claim 1, wherein the transformable type cooler includes a cooler body forming a coolant chamber, wherein the transformable member is formed of a metal plate, wherein a periphery of the transformable member is fixed to the cooler body so that the transformable member is used as a cover of the coolant chamber, and wherein a transformable amount of the transformable member is controlled by an operational amount of the sandwiching means.

3. The double-sided cooling type semiconductor module of claim 2, wherein the cooler body includes a metal laminate that is formed by piling up metal plates.

4. The double-sided cooling type semiconductor module of claim 1, wherein the sandwiching means includes:

a pressing frame adjoining and pressing the fixed type cooler in a direction of the transformable type cooler; and fastening means that fastens the pressing frame to the transformable type cooler, and wherein, while a pressing pressure applied to the fixed type cooler is varied according to an operational amount of the fastening means, the pressing pressure is applied to the transformable member of the transformable type cooler via the semiconductor device.

5. The double-sided cooling type semiconductor module of claim 1 wherein the sandwiching means uses a pressure of the coolant.

6. A double-sided cooling type semiconductor module comprising:

a semiconductor device;

first and the second coolers sandwiching the semiconductor device, wherein each of the first and second coolers includes a coolant; and sandwiching means causing the first and second cooler to tightly sandwich the semiconductor device, wherein at least the first cooler includes a transformable member, the transformable member includes a first surface facing the coolant and a second surface facing the semiconductor device, the transformable member is transformable to be flexed in one of a coolant direction and a semiconductor device direction, the first cooler is a transformable type cooler that includes an additional transformable member, in addition to the transformable member, and a cooler body forming a coolant chamber, each of the transformable member and the additional transformable member is formed of a metal plate, a periphery of the transformable member is fixed to the cooler body such that the transformable member is used as a cover of the coolant chamber to accept heat from the semiconductor device, the additional transformable member is disposed to face the transformable member via the coolant chamber while including a support member upwardly protruding toward the transformable member within the coolant chamber, and the sandwiching means presses the support member in a direction from the additional transformable member to the transformable member so that the support member causes the transformable member to be pressed in a direction of the semiconductor device according to an operation of the sandwiching means.

7. The double-sided cooling type semiconductor module of claim 6,
wherein the sandwiching means includes:
a base member whose positional relation with the cooler body of the transformable type cooler is fixed; and
pressing contact means attached to the base member and being movable in both approaching and departing direction with respect to the support member of the additional transformable member,
wherein, according to an operational amount of the pressing contact means, a movable amount toward the transformable member of the base support member is varied, and
wherein, according to the movable amount toward the transformable member of the base support member that causes the transformable member to be pressed, a variation amount toward the semiconductor device of the transformable member is varied.

8. The double-sided cooling type semiconductor module of claim 7,
wherein the second cooler is a fixed type cooler whose positional relationship with the semiconductor device is fixed, and
wherein the fixed type cooler and the base member is linked by a linking member such that a positional relationship between the fixed type cooler and the base member is fixed.

9. The double-sided cooling type semiconductor module of claim 6, wherein the sandwiching means uses a pressure of the coolant.

10. A double-sided cooling type semiconductor module comprising:
a semiconductor device;
first and second coolers sandwiching the semiconductor device, wherein each of the first and second coolers includes a coolant; and
sandwiching means causing the first and second coolers to tightly sandwich the semiconductor device, wherein
at least the first cooler includes a transformable member,
the transformable member includes a first surface facing the coolant and a second surface facing the semiconductor device,
the transformable member is transformable to be flexed in one of a coolant direction and a semiconductor device direction,
each of the first and second coolers includes the transformable member to be a transformable type cooler,
the transformable type cooler includes a cooler body forming a coolant chamber,
the transformable member is formed of a metal plate and a periphery of the transformable member is fixed to the cooler body so that the transformable member is used as a cover of the coolant chamber, and
a variation amount of the transformable member is controlled by an operational amount of the sandwiching means.

11. The double-sided cooling type semiconductor module of claim 10, wherein the sandwiching means uses a pressure of the coolant.

12. A double-sided cooling type semiconductor module comprising:
a semiconductor device;
first and second coolers sandwiching the semiconductor device, wherein each of the first and second coolers includes a coolant; and
sandwiching means causing the first and second coolers to tightly sandwich the semiconductor device, wherein
at least the first cooler includes a transformable member,
the transformable member include a first surface facing the coolant and a second surface facing the semiconductor device,
the transformable member is transformable to be flexed in one of a coolant direction and a semiconductor device direction, and
of the transformable member, the first surface facing the coolant includes a cooling fin.

13. The double-sided cooling type semiconductor module of claim 12, wherein the sandwiching means uses a pressure of the coolant.

* * * * *